US011164850B2

(12) United States Patent
Scholz et al.

(10) Patent No.: US 11,164,850 B2
(45) Date of Patent: Nov. 2, 2021

(54) ARRANGEMENT COMPRISING A PLURALITY OF LIGHTING MODULES AND METHOD FOR PRODUCING AN ARRANGEMENT COMPRISING A PLURALITY OF LIGHTING MODULES

(71) Applicant: OSRAM Opto Semiconductors GmbH, Regensburg (DE)

(72) Inventors: Dominik Scholz, Bad Abbach (DE); Siegfried Herrmann, Neukirchen (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 16/622,669

(22) PCT Filed: Jun. 13, 2018

(86) PCT No.: PCT/EP2018/065679
§ 371 (c)(1),
(2) Date: Dec. 13, 2019

(87) PCT Pub. No.: WO2018/234119
PCT Pub. Date: Dec. 27, 2018

(65) Prior Publication Data
US 2020/0251450 A1 Aug. 6, 2020

(30) Foreign Application Priority Data
Jun. 20, 2017 (DE) .......................... 102017113573.1

(51) Int. Cl.
*H01L 25/075* (2006.01)
*H01L 33/50* (2010.01)
(Continued)

(52) U.S. Cl.
CPC ........ *H01L 25/0753* (2013.01); *H01L 33/504* (2013.01); *H01L 33/58* (2013.01);
(Continued)

(58) Field of Classification Search
CPC ... H01L 25/0753; H01L 33/504; H01L 33/58; H01L 33/62; H01L 2933/0041;
(Continued)

(56) References Cited

U.S. PATENT DOCUMENTS

2016/0247855 A1   8/2016   von Malm
2017/0009971 A1 * 1/2017   Chan ...................... H05K 1/181
(Continued)

FOREIGN PATENT DOCUMENTS

DE   102017100716 A1      7/2018
JP   2013171942       *   9/2013    ............. H01L 24/97
JP   2013171942   A       9/2013

*Primary Examiner* — Victor A Mandala
(74) *Attorney, Agent, or Firm* — Slater Matsil, LLP

(57) ABSTRACT

An arrangement having a plurality of lighting modules and a method for producing an arrangement having a plurality of lighting modules are disclosed. In an embodiment an arrangement includes a plurality of lighting modules held by a carrier, each lighting module having a plurality of optoelectronic components arranged in a first number of rows and a second number of columns, wherein the lighting modules include a respective first number of first electrodes and a respective second number of second electrodes, wherein the optoelectronic components of a respective row of the rows are electrically connected to one of the first electrodes of the respective lighting module, wherein the optoelectronic components of a respective column of the columns are electrically connected to one of the second electrodes of the respective lighting module, and wherein the carrier includes one third electrode per row and one
(Continued)

fourth electrode per column, the electrodes being electrically contactable in each case from outside the carrier.

13 Claims, 14 Drawing Sheets

(51) Int. Cl.
*H01L 33/58* (2010.01)
*H01L 33/62* (2010.01)

(52) U.S. Cl.
CPC ...... *H01L 33/62* (2013.01); *H01L 2933/0041* (2013.01); *H01L 2933/0058* (2013.01); *H01L 2933/0066* (2013.01)

(58) Field of Classification Search
CPC ..... H01L 2933/0058; H01L 2933/0066; H01L 25/167
See application file for complete search history.

(56) References Cited

U.S. PATENT DOCUMENTS

| | | | |
|---|---|---|---|
| 2017/0294479 A1* | 10/2017 | Cha | H01L 27/156 |
| 2019/0103516 A1* | 4/2019 | Moosburger | H01L 33/24 |
| 2019/0237443 A1* | 8/2019 | Schwarz | G09F 9/00 |
| 2020/0035134 A1* | 1/2020 | Pahlevaninezhad | G09F 9/3026 |

* cited by examiner

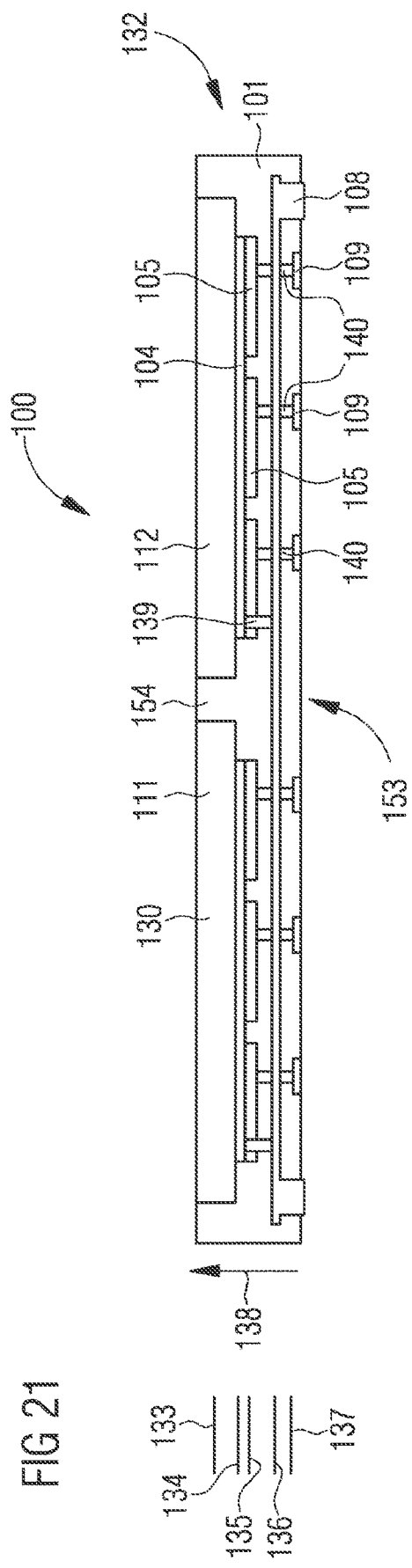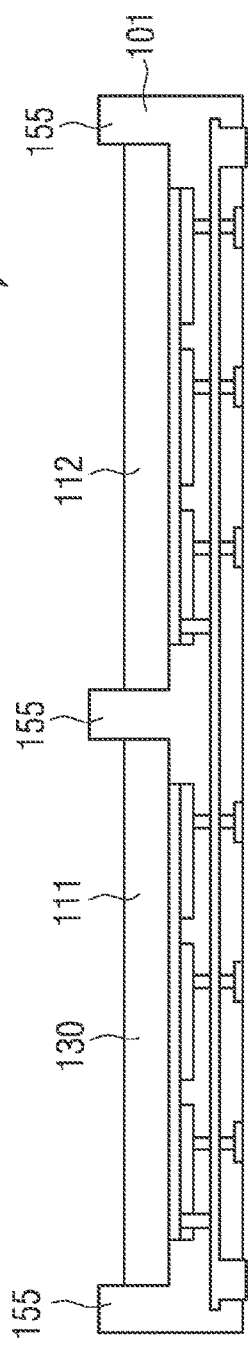
FIG 21
FIG 22

ARRANGEMENT COMPRISING A PLURALITY OF LIGHTING MODULES AND METHOD FOR PRODUCING AN ARRANGEMENT COMPRISING A PLURALITY OF LIGHTING MODULES

This patent application is a national phase filing under section 371 of PCT/EP2018/065679, filed Jun. 13, 2018, which claims the priority of German patent application 102017113573.1, filed Jun. 20, 2017, each of which is incorporated herein by reference in its entirety.

TECHNICAL FIELD

The application relates to an arrangement comprising a plurality of lighting modules, wherein the lighting modules each comprise in particular a plurality of optoelectronic components, for example, light-emitting diodes and/or sensors. The application furthermore relates to a method for producing an arrangement comprising a plurality of such lighting modules.

SUMMARY OF THE INVENTION

Embodiments provide an arrangement comprising a plurality of lighting modules which enables a simple interconnection. Further embodiments provide a method for producing an arrangement comprising a plurality of lighting modules which enables a simple interconnection.

In accordance with at least one embodiment, an arrangement comprises a plurality of lighting modules. The lighting modules are held by a carrier. The lighting modules are designed to emit light, for example, visible light or light in the infrared and/or ultraviolet range, during operation when an electrical voltage is applied.

In accordance with at least one embodiment, the lighting modules each comprise a plurality of optoelectronic components. In accordance with embodiments, the optoelectronic components are light-emitting diodes, for example, organic or inorganic light-emitting diodes. When a voltage is applied, the diodes each emit electromagnetic radiation, for example, in the visible range, in the ultraviolet range, and/or in the infrared range. In accordance with further embodiments, the optoelectronic components are alternatively or additionally sensors, for example, sensors formed on the basis of semiconductors.

In accordance with at least one embodiment, the optoelectronic components per lighting module are arranged in a first number of rows and a second number of columns. The optoelectronic components per lighting module are arranged, for example, in a matrix. It is also possible, in the case of the arrangement of the optoelectronic components in the lighting module and/or of the lighting modules within the arrangement of lighting modules, to deviate from the strict matrix form and to realize freeform arrangements.

By way of example, the optoelectronic components are arranged in three rows and three columns. The lighting module thus comprises nine optoelectronic components. It goes without saying that a different number of rows and columns and thus a different number of optoelectronic components per lighting module are also possible.

In accordance with embodiments, the lighting modules each have the same number of optoelectronic components. In accordance with further embodiments, the number of optoelectronic components per lighting module is mutually different at least in the case of a portion of the lighting modules.

In accordance with embodiments, the number of rows and columns per lighting module is identical. In accordance with further embodiments, the first number of rows is different from the second number of columns.

In accordance with at least one embodiment, the lighting modules comprise the respective first number of first electrodes. Per row the lighting modules comprise a respective one of the first electrodes. In the case of three rows, the lighting module thus comprises three first electrodes.

In accordance with at least one embodiment, the lighting modules comprise the respective second number of second electrodes. Per column the lighting modules comprise a respective one of the second electrodes. In the case of three columns, the lighting module thus comprises three second electrodes.

In accordance with at least one embodiment, the optoelectronic components of a respective row of the rows are electrically connected to one of the first electrodes of the respective lighting module. Consequently, all the optoelectronic components of a row of a lighting module are electrically connected to a common first electrode. If a voltage is applied to the first electrode of the row during operation, all the optoelectronic components of this row can likewise be supplied with the voltage.

In accordance with at least one embodiment, the optoelectronic components of a respective column of the columns are electrically connected to one of the second electrodes of the respective lighting module. Consequently, all the optoelectronic components of a column of a lighting module are electrically connected to a common second electrode. If voltage is applied to the second electrode during operation, all the optoelectronic components of the corresponding column can thus likewise be suppled with the voltage.

In accordance with embodiments, one of the first electrode and the second electrode serves as a p-type contact and the other of the first electrode and the second electrode serves as an n-type contact. If a voltage is applied to one of the first electrodes and to one of the second electrodes during operation, for example, the optoelectronic component emits light which is arranged in the row of said first electrode and the column of said second electrode.

In accordance with at least one embodiment, the carrier comprises one third electrode per row and one fourth electrode per column. The third electrode and the fourth electrode are electrically contactable in each case from outside the carrier. The third electrode and the fourth electrode thus serve, for example, for coupling the arrangement to a voltage source.

In accordance with at least one embodiment, the first electrodes of a respective one of the rows are electrically connected to one of the third electrodes. By means of the third electrode it is thus possible to jointly contact all first electrodes which are arranged in a row and which belong to different lighting modules. If voltage is applied to the third electrode of a row, this voltage is present at all first electrodes of said row. It is thus possible to drive a plurality of lighting modules by means of the third electrode. All first electrodes of a row, even if they belong to different lighting modules, are thus electrically connected in particular to a common third electrode.

In accordance with at least one embodiment, the second electrodes of a respective one of the columns are connected to one of the fourth electrodes. By means of the fourth electrode, it is thus possible to jointly contact all second electrodes which are arranged in a column and which belong to different lighting modules. The second electrodes which are arranged in a column and which belong to different lighting modules are thus connected to a common fourth electrode. During operation, the fourth electrode serves to supply all second electrodes of a column with voltage, even if the second electrodes belong to different lighting modules.

If a voltage is applied to a third electrode and a fourth electrode during operation, then the lighting module whose first electrode lies in the row of said third electrode and whose second electrode lies in the column of said fourth electrode is supplied with voltage. Furthermore, the optoelectronic component of said lighting module which lies in said row of the third electrode and said column of the fourth electrode is supplied with voltage.

The third and fourth electrodes can be arranged in such a way that they do not extend exclusively within a plane, but rather are led through locally, for example, toward the emission side or rear side to the outside, in order to enable further electrical components to be mounted in subsequent processes. This subsequent mounting of further components can be carried out downstream in the manufacturing process.

In accordance with at least one embodiment, an arrangement comprises a plurality of lighting modules. The lighting modules are held by a carrier. The lighting modules each comprise a plurality of optoelectronic components. The lighting modules are arranged in a first number of rows and a second number of columns. The lighting modules comprise the respective number of first electrodes and the respective second number of second electrodes. The optoelectronic components of a respective row of the rows are electrically connected to one of the first electrodes of the respective lighting module. The optoelectronic components of a respective column of the columns are electrically connected to one of the second electrodes of the respective lighting module. The carrier comprises one third electrode per row and one fourth electrode per column. The third electrode and the fourth electrode are electrically contactable in each case from outside the carrier. The first electrodes of a respective one of the rows are electrically connected to one of the third electrodes. The second electrodes of a respective one of the columns are electrically connected to one of the fourth electrodes.

The arrangement according to the application, the carrier of which is composed of a molding material (mold material), for example, enables a simple interconnection and/or driving of complex finely pixelated modules. The arrangement can be used for video walls, for example. Solid State Lighting (SSL) is additionally possible. Color locus control and/or direction-dependent space illumination are/is made possible.

In this case, an arrangement described herein and a method described herein are based on the following considerations, inter alia. In the case of a conventional chip package having integrated circuits, for example, a semiconductor chip size package (CSP), arbitrary applications cannot be realized for geometric reasons.

The arrangement described herein and the method described herein now make use of the concept, inter alia, of realizing an arrangement comprising a multiplicity of chips. For the interconnection and/or driving of individual regions (pixels), a concept with segmented on-chip electrodes is specified. A first on-chip interconnection structure comprising the first electrode and the second electrode, also referred to as microscopic interconnection structure, is in the micrometers range. A second interconnection structure comprising the third electrode and the fourth electrode, also referred to as macroscopic interconnection structure, is in the millimeters range. The first interconnection structure and the second interconnection structure form one unit, in particular. By way of example, an optoelectronic component has a size of 1 to 500 µm. A distance between directly adjacent optoelectronic components is, for example, between 1 and 500 µm, in particular between 1 and 20 µm. The size of a lighting module is, for example, between 50 and 2000 µm. A distance between directly adjacent lighting modules is, for example, between 20 µm and 2 cm or more.

The lighting modules each comprise an LED chip having a pixelation in the micrometers range. In particular, the pixelation is predefined on the basis of the first number of rows and the second number of columns. The lighting modules each comprise the first on-chip interconnection structure, also referred to as redistribution wiring. The redistribution wiring is based on two vertically stacked electrodes, the first electrode and the second electrode. In particular, the electrodes are embodied in a layer like fashion. The layers are segmented in order to form the first electrode per row and the second electrode per column.

The separate driving of the individual pixels necessitates in each case only one vertical contact feedthrough to the respective first and second electrode. In this regard, by way of example, with six contacts it is possible for nine individual pixels (lighting modules comprising 3×3 optoelectronic components) to be addressed separately.

The vertical contact feedthrough from the microscopic wiring plane into the macroscopic wiring plane comprises an insulation layer in the electrodes.

The lighting modules constructed in this way are in turn specified in particular in a matrix arrangement on the carrier. They are in the range of a few millimeters. The vertical contact feedthroughs of the individual lighting modules form the connections for the macroscopic redistribution wiring. The redistribution wiring forms, from the individual lighting modules, an expanded LED carrier having integrated lighting modules. The number of possible pixels of the arrangement given a first number A of rows and a second number B of columns per lighting module and a third number P and a fourth number Q of lighting modules per arrangement is PxQxAxB.

In particular, on the carrier plane, the redistribution wiring with the third electrode and the fourth electrode is realized, with the aid of which all the lighting modules are contacted jointly and, for example, the p-n-type contacts for all the pixels are led out laterally. The redistribution wiring is galvanically reinforced, for example, and the arrangement thus has a high current capability. In particular, a current density of greater than 1 A/mm$^2$ is possible. The third electrode and the fourth electrode are embodied in each case, for example, as thick metal tracks, for example, a few 10 µm thick, and in particular provide sufficient mechanical stability and also enable heat transfer. By way of example, an insulation layer is arranged for electrically isolating the third and fourth electrodes. Moreover, plated-through openings are provided, in particular, for the vertical feedthrough of electrical contacts.

The overall construction thus comprises four vertical wiring planes, wherein two wiring planes are formed on the chip structure. Two further wiring planes are formed in the carrier.

The individual lighting modules can be made comparatively small in particular with the first number of rows and the second number of columns and the corresponding number of optoelectronic components or pixels. This enables manufacturing with a high yield. For construction on the carrier, these lighting modules can be sorted. The expansion factor of the tiles on the carrier can be chosen in a variable manner in accordance with the requirement of the desired product. Expensive semiconductor area can be saved in this way. Given a sufficiently large expansion factor, further component parts and components, for example, ESD protective diodes or sensor elements, can be accommodated in the interspace between the tiles that is not occupied by lighting modules. Communication interfaces are also possible. These further component parts are thus integratable into the arrangement in particular without taking up further space.

In accordance with at least one embodiment, the optoelectronic components of a respective one of the lighting modules comprise a common semiconductor layer sequence which extends in a planar manner having an active layer. The semiconductor layer sequence emits electromagnetic radiation when a voltage is applied. The first electrodes and the second electrodes are embodied in each case in strip-shaped fashion and are arranged at a main side of the semiconductor layer sequence. The first electrodes and the second electrodes here can, for example, also have cutouts and/or have wavy structures.

The first electrodes and the second electrodes are arranged on the same main side of the semiconductor layer sequence. The strips of the first electrode extend in particular transversely or obliquely with respect to the strips of the second electrode. The first electrodes are oriented perpendicularly to the second electrodes in particular in the context of the customary tolerances.

In accordance with at least one embodiment, the lighting modules are arranged next to one another along a first plane. The lighting modules are arranged next to one another on the carrier. The first electrodes are arranged in particular along a second plane. The second electrodes are arranged along a third plane. The third electrodes are arranged along a fourth plane. The fourth electrodes are arranged along a fifth plane. The second, the third, the fourth and the fifth plane are spaced at different distances from the first plane. In particular, the fifth plane is spaced at a further distance from the first plane than the fourth plane. The fourth plane is spaced at a further distance from the first plane than the third plane. The third plane is spaced at a further distance from the first plane than the second plane. The second plane is the plane which is arranged closest to the first plane. This results in a stacked construction of the first, the second, the third and the fourth electrodes along a stacking direction of the arrangement.

In accordance with at least one embodiment, the arrangement comprises, for each first electrode, at least one first feedthrough which connects the first electrode in each case to the corresponding third electrode. The electrical contacting between the third electrode of the carrier and the corresponding first electrodes of the lighting modules is thus realized.

In accordance with at least one embodiment, the arrangement comprises, for each second electrode, at least one second feedthrough which connects the second electrode in each case to the corresponding fourth electrode. The electrical contacting of the fourth electrode of the carrier with the corresponding second electrodes of the lighting modules is thus realized.

In accordance with at least one embodiment, the first feedthrough and the second feedthrough are oriented in each case transversely with respect to the first plane. The first and the second feedthrough are directed in particular identically to the stacking direction.

In accordance with at least one embodiment, the carrier comprises a light-transmissive partial region composed of a molding. The partial region covers the lighting modules on a side facing away from the electrodes. The side is, for example, the light exit side during operation. In accordance with at least one embodiment, the partial region comprises a plurality of integrated optical units. A respective one of the optical units is assigned to one of the optoelectronic components. It is thus possible to configure the optical units pixel-finely. Moreover, the optical units are molded directly in the carrier, in particular in the partial region of the carrier. The optical units of the arrangement are thus formed directly during the production of the arrangement and do not have to be subsequently applied, for example, adhesively bonded. In particular the optical units are part of the carrier.

In accordance with at least one embodiment, the arrangement comprises at least one further component held by the carrier. In accordance with at least one embodiment, the further component is electrically coupled to the lighting modules. The further component is, for example, at least one from: a sensor, an integrated circuit component, a power switch, a communication interface, an ESD protective diode and at least one further element which is beneficial during the operation of the arrangement.

In accordance with at least one embodiment, the arrangement comprises a first converter for the partial conversion of a primary radiation, said first converter covering a portion of the lighting modules. In accordance with at least one embodiment, the arrangement comprises a second converter, which covers a further portion of the lighting modules.

The primary radiation is the radiation emitted by the optoelectronic component or the optoelectronic components. The first and/or the second converter, comprising, for example, a phosphor or some other conversion material, convert at least part of said primary radiation into radiation of a different wavelength. It is thus possible to generate light having different wavelengths. The first converter and the second converter each cover different lighting modules. Converter concepts at the lighting module level are thus realized. The different lighting modules are configured for emitting electromagnetic radiation having mutually different wavelengths.

In accordance with at least one embodiment, the arrangement comprises a converter, which covers all the lighting modules, particularly if the optoelectronic components are light-emitting diodes. A converter concept at the arrangement level is thus realized.

In accordance with at least one further embodiment, the arrangement comprises a first converter for the partial conversion of a primary radiation, the first converter covering a portion of the optoelectronic components. In accordance with at least one further embodiment, the arrangement comprises a second converter, which covers a further portion of the optoelectronic components. A converter concept at pixel level is thus realized. The individual optoelectronic components of the lighting modules together with the respective assigned converter thus emit mutually different wavelengths. A combination of the different converter concepts is also possible. By way of example, a first converter can cover the entire lighting module and a further converter can additionally cover a portion of the optoelectronic components of the lighting module.

A method for producing an arrangement comprising a plurality of lighting modules is also specified. In particular, the arrangement corresponds to at least one of the embodiments described. In accordance with at least one embodiment, the method comprises providing the plurality of lighting modules, each comprising a plurality of optoelectronic components. The optoelectronic components are arranged in particular in a first number of rows and a second number of columns. The lighting modules in particular each comprise the first number of first electrodes and the second number of second electrodes. The optoelectronic components of a respective row of the rows are electrically connected in particular to one of the first electrodes of the respective lighting module. The optoelectronic components of a respective column of the columns are each electrically connected in particular to one of the second electrodes of the respective lighting module.

In accordance with at least one embodiment, the lighting modules are arranged on a common carrier element. By way of example, for this purpose, a molding is molded around the lighting modules. The molding is then cured to form the carrier element.

In accordance with at least one further embodiment, one third electrode per row is applied to the carrier element.

In accordance with at least one embodiment, one fourth electrode per column is applied to the carrier element. The carrier element together with the third electrode and the fourth electrode forms at least part of the carrier.

In accordance with at least one embodiment, the first electrodes of a respective one of the rows are electrically connected to one of the third electrodes.

In accordance with at least one embodiment, the second electrodes of a respective column are electrically connected to one of the fourth electrodes.

All embodiments, developments and advantages for the arrangement also apply to the production method, and vice versa.

In accordance with at least one embodiment, providing the lighting modules comprises providing a semiconductor layer sequence which extends in a planar manner having an active layer. The first electrode is applied to a main side of the semiconductor layer sequence. The second electrode is applied to the main side of the semiconductor layer sequence. In particular, the first electrode and the second electrode are applied to the same side of the active layer successively with respect to one another. The first electrodes are applied in strip-shaped fashion and the second electrodes are applied to said electrodes in particular in strip-shaped fashion in a manner rotated by. By way of example, an insulation or passivation is applied between the electrodes.

In accordance with at least one further embodiment, providing the lighting modules comprises applying a molding to a side of the lighting modules facing away from the electrodes. The molding is a light-transmissive molding, in particular. A plurality of optical units are formed by means of the molding, such that a respective optical unit of the optical units is assigned to one of the optoelectronic components. It is thus possible to form the pixel-fine optical units by means of the light-transmissive molding during production of the carrier.

In accordance with at least one embodiment, a first converter for the partial conversion of a primary radiation is applied to a portion of the lighting modules. In accordance with at least one embodiment, a second converter is applied to a further portion of the lighting modules. The first converter is applied in particular to a different portion of the lighting modules than the second converter.

In accordance with at least one further embodiment, a first converter for the partial conversion of a primary radiation is applied to a portion of the optoelectronic components. In accordance with at least one embodiment, a second converter is applied to a further portion of the optoelectronic components. The first converter is applied in particular on a different portion of the optoelectronic components than the second converter. It is also possible to apply one of the converters to an entire lighting module and a further converter to a portion of the pixels of said lighting module.

In accordance with at least one further embodiment, a further component is arranged on the carrier element. The further component is electrically coupled to the optoelectronic components. The electrical component serves, in particular, to beneficially influence the light emission of the individual optoelectronic components and/or of the individual modules during operation.

BRIEF DESCRIPTION OF THE DRAWINGS

Further advantages, configurations and developments will become apparent from the following exemplary embodiments explained in association with the figures.

In the Figures:

FIGS. 21 to 29 each show sectional views of an arrangement in accordance with various exemplary embodiments.

Elements that are identical, of identical type or act identically can be provided with the same reference signs in the figures. The figures and the proportions of the elements illustrated in the figures among one another should not be regarded as true to scale. Rather, individual elements may be illustrated with an exaggerated size in order to enable better illustration and/or to facilitate comprehension.

The arrangement according to the application is explained in various exemplary embodiments below on the basis of light-emitting diodes as optoelectronic components. The features, advantages and developments correspondingly also apply to exemplary embodiments in which the optoelectronic components are embodied wholly or partly as sensors, for example, brightness sensors.

DETAILED DESCRIPTION OF ILLUSTRATIVE EMBODIMENTS

Figure 1:
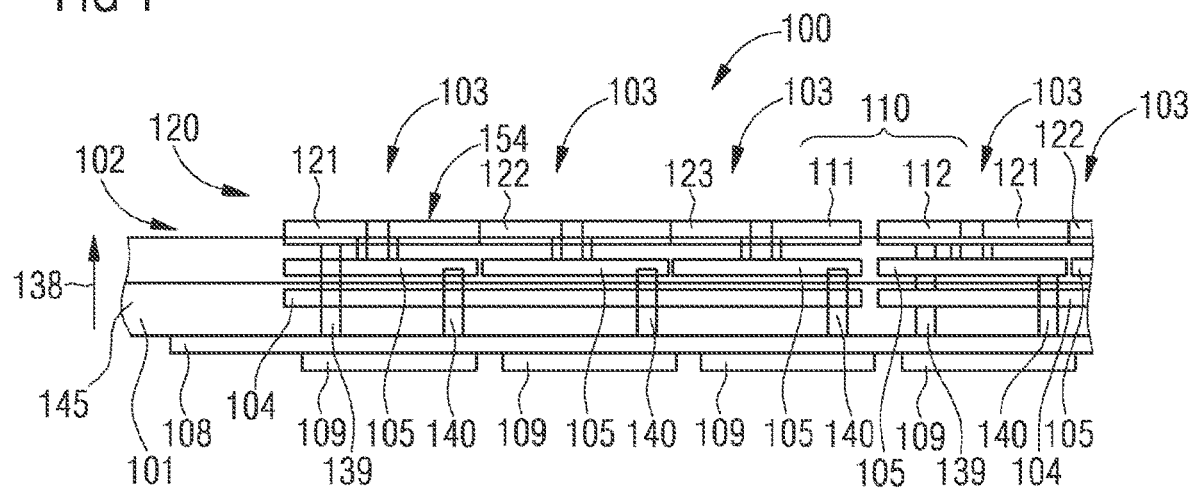
FIG. 1 shows a schematic illustration of an arrangement in accordance with an exemplary embodiment.
Figure 2:
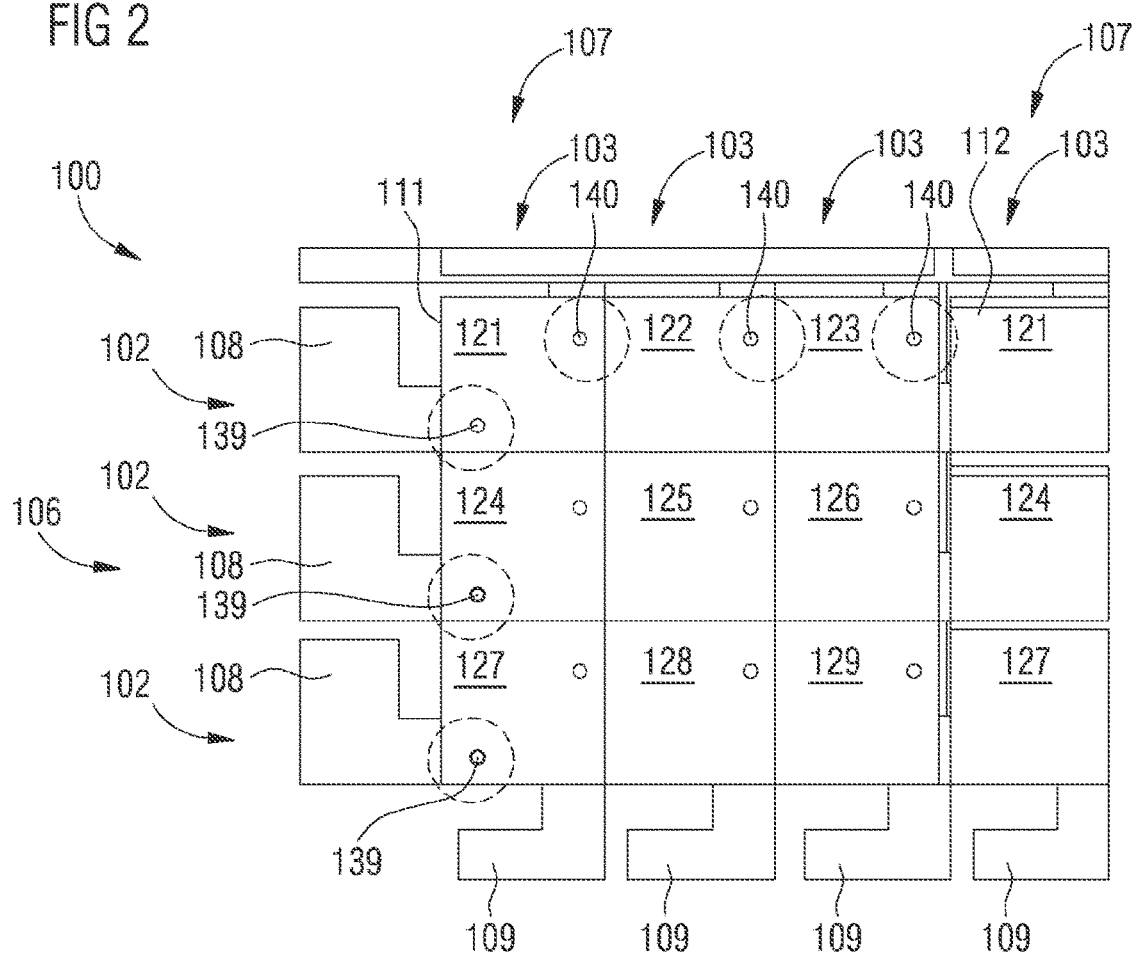
FIG. 2 shows a schematic illustration of an arrangement in accordance with an exemplary embodiment.

FIG. 1 shows a schematic illustration of an arrangement 100 in accordance with one exemplary embodiment. The arrangement 100 comprises a carrier 101. The carrier 101 is formed in particular from a molding, for example, from a plastic. In accordance with exemplary embodiments, the carrier 101 is composed of various elements. By way of example, the carrier 101 comprises a carrier element 145 composed of a first molding material. The carrier 101 additionally comprises a plurality of third electrodes 108 and a plurality of fourth electrodes 109. As shown in FIG. 2, for example, the third electrodes 108 and the fourth electrodes 109 are each embodied in strip-shaped fashion and extend transversely with respect to one another.

Figure 4:
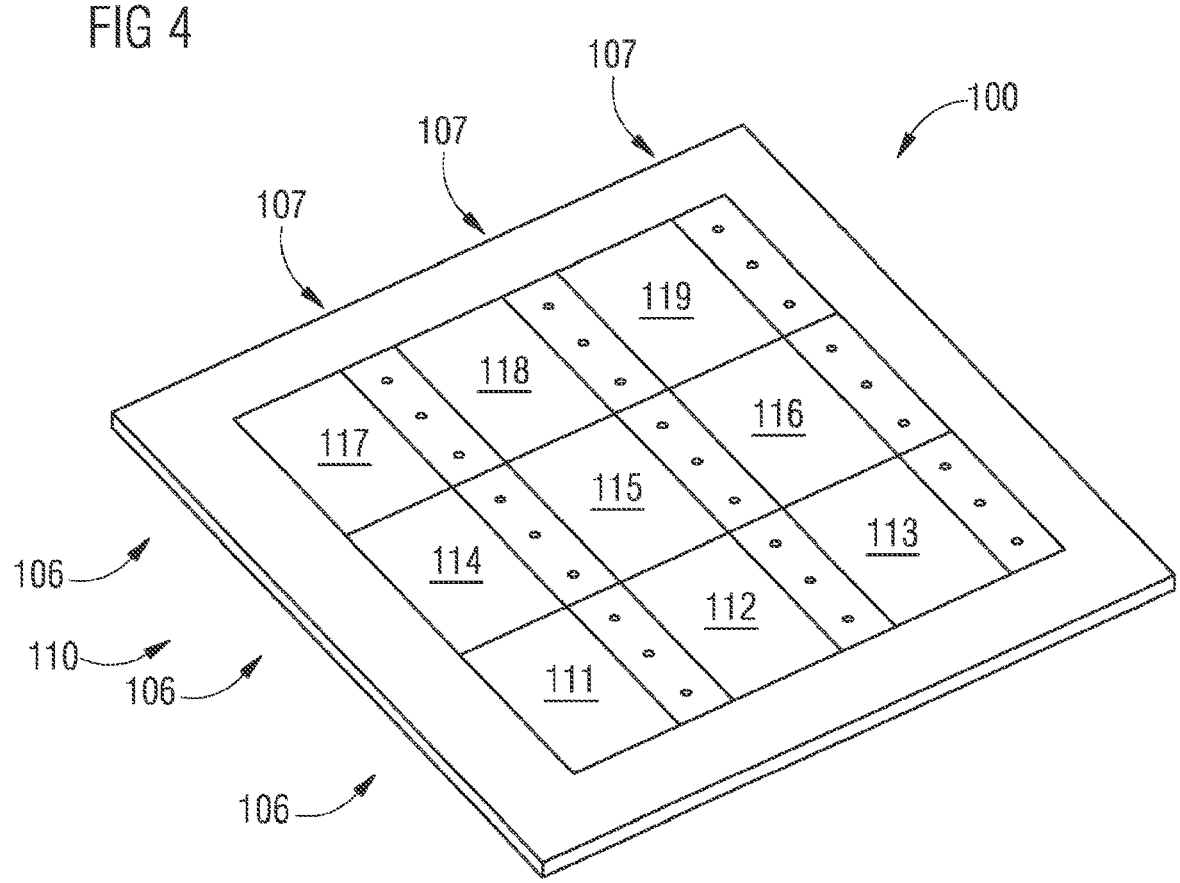
FIG. 4 shows a schematic illustration of an arrangement in accordance with an exemplary embodiment.

The carrier 101 is configured to carry a plurality 110 of lighting modules 111 to 119 (FIG. 4). By way of example, the lighting modules 111 to 119 are each partly enclosed by the carrier element 145.

Figure 6:
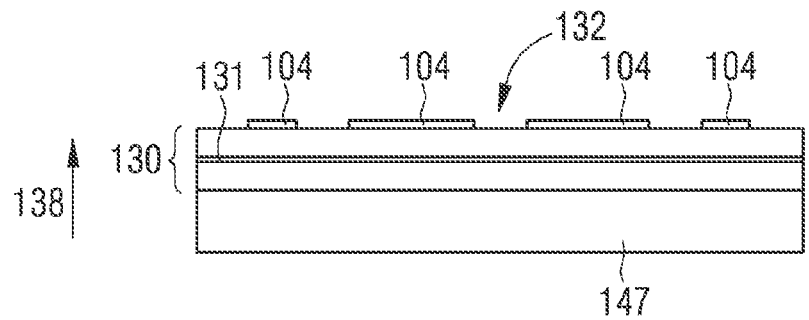
FIGS. 6 to 20 show schematic illustrations of different method stages during the production of an arrangement in accordance with an exemplary embodiment.

The lighting modules 111 to 119 each comprise a plurality 120 of light-emitting diodes 121 to 129 (FIG. 2). The light-emitting diodes 121 to 129 of one of the lighting modules 111 to 119 comprise, for example, a semiconductor layer sequence 130 having an active layer 131 (FIG. 6). In particular, each of the lighting modules 111 to 119 comprises exactly one semiconductor layer sequence 130. The active layer 131 is suitable in particular for generating a primary radiation in a first wavelength range having a first wavelength. For this purpose, the active layer preferably contains a pn junction, a double heterostructure, a single quantum well structure or a multi quantum well structure for generating radiation. The semiconductor layer stack preferably contains a III/V semiconductor material. The III/V semiconductor materials are suitable in particular for generating radiation in the ultraviolet through the visible range to the infrared spectral range.

Figure 11:
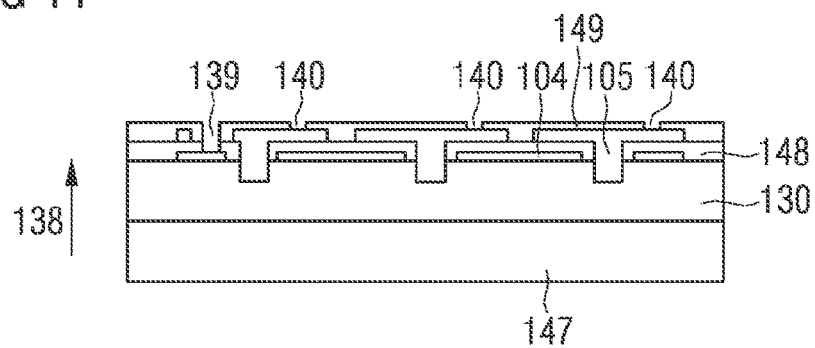

The lighting modules 111 to 119 each comprise a plurality of first electrodes 104 and a plurality of second electrodes 105 (FIG. 11). The first electrodes 104 each extend along a row 120 of the respective lighting module 111 to 119. The second electrodes each extend along a column 103 of the respective lighting module 111 to 119.

By means of a first feedthrough 139, the first electrodes 104 of different lighting modules 111 to 119 are connected to a common third electrode 108. The first electrodes 104 of a row of the arrangement 100 are electrically connected to a common third electrode 108 by means of respective first feedthroughs 139. The first feedthroughs 139 extend in particular substantially perpendicularly to the main extension planes of the electrodes. In particular, the first feedthroughs 139 each extend in the same direction to a stacking direction 138, along which the arrangement 100 is constructed.

The second electrodes 105 of a plurality of lighting modules 111 to 119, per column of the arrangement 140 are electrically connected to a common fourth electrode 109. The electrical connection is realized in particular by means of a plurality of second feedthroughs 140. The second feedthroughs 140 are oriented in each case transversely with respect to the main extension planes of the electrodes. The second feedthroughs 140 in particular each extend in the same direction to the stacking direction 138.

Figure 3:
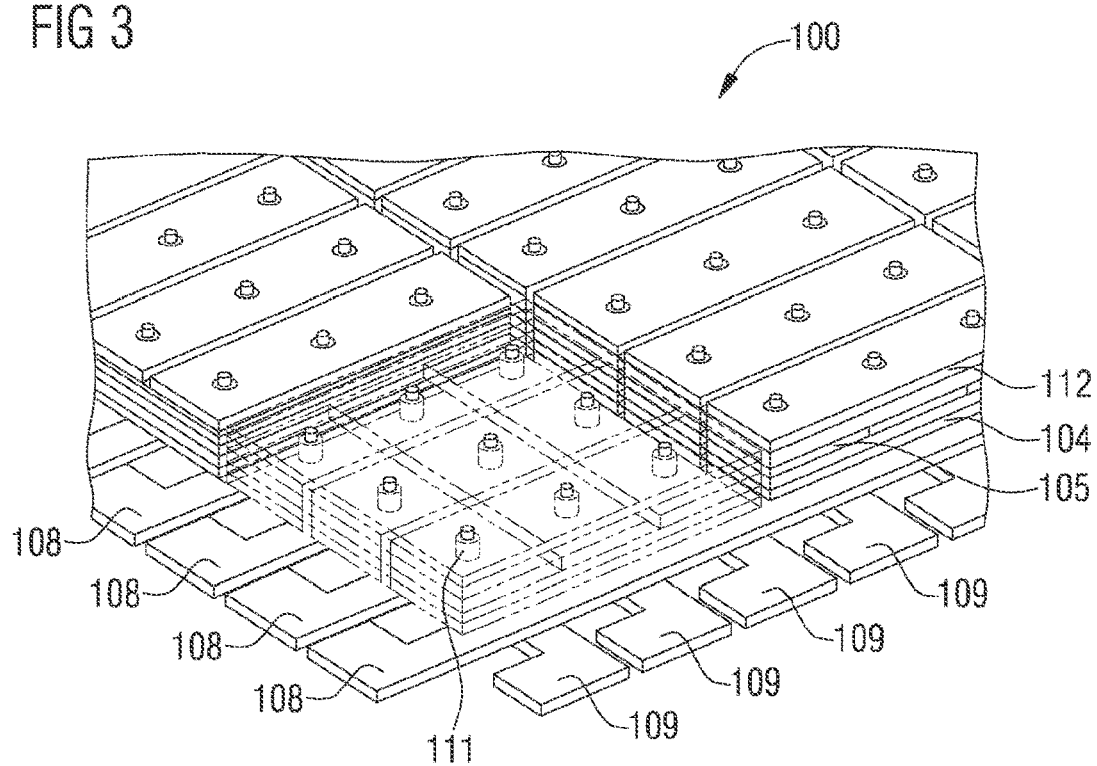
FIG. 3 shows a schematic illustration of an arrangement in accordance with an exemplary embodiment.

As also becomes evident from FIGS. 2 and 3, the arrangement 100 comprises exactly one third electrode 108 per row 102 of the light-emitting diodes 121 to 129. The third electrode 108 is connected to all first electrodes 104 of the corresponding column 102 by means of a respective feedthrough 139. By way of example, the light-emitting diodes 127, 128 and 129 of a row 106 of the lighting modules 111 to 119 are electrically connected to the corresponding third electrode 108 in each case via a corresponding first electrode 104.

By way of example, the light-emitting diodes 121, 124 and 127 of a column 103, per lighting module 111 to 119, are each connected to a common second electrode 105. The second electrodes 105 per column 103 of the light-emitting diodes 121 to 129 of different lighting modules 111 to 119 of a column 107 of the lighting modules are electrically connected to a common fourth electrode 109, in particular by means of a respective feedthrough 140.

As shown in FIG. 4, in particular, the lighting modules 111 to 119 are arranged in a number P of the rows 106, in three rows 106 in the exemplary embodiment illustrated. The lighting modules 111 to 119 are additionally arranged in a number Q of columns 107, three columns 107 in the exemplary embodiment illustrated. Consequently, in the exemplary embodiment illustrated, the plurality no comprises nine lighting modules 111 to 119, namely P x Q. Of course, a different number of lighting modules is also possible. In particular, it is possible for the number of rows 106 to be equal to the number of columns 107. However, it is also possible for the number of rows 106 to differ from the number of columns 107.

Each lighting module of the lighting modules 111 to 119 comprises the plurality 120 of light-emitting diodes 121 to 129, as shown in FIG. 2, in particular. The light-emitting diodes 121 to 129 are arranged in a plurality of rows 102 and a plurality of columns 103. In the exemplary embodiment illustrated, the light-emitting diodes 121 to 129 of the lighting module 111 are arranged in three rows 102 and three columns 103. A different number of rows 102 and columns 103 is also possible. In accordance with embodiments, the number of rows 102 is equal to the number of columns 103. In accordance with further embodiments, the number of rows 102 and the number of columns 103 differ from one another. In particular, the number of light-emitting diodes 121 to 129 per lighting module 111 to 119 is identical. In accordance with further embodiments, the number of light-emitting diodes per lighting module is different. It is also possible for a portion of the lighting modules to comprise the same number of light-emitting diodes and a further portion of the lighting modules to comprise a different number of light-emitting diodes relative thereto.

The light-emitting diodes 127, 128 and 129 of one of the rows 102 of the lighting module 111 are electrically connected to a common first electrode 103. The light-emitting diodes 121, 124 and 127 of one of the columns 103 of the lighting module 111 are electrically connected to a common second electrode 105. The remaining rows 102 and columns 103 of the lighting module 111 are constructed correspondingly. The remaining lighting modules 112 to 119 are constructed in a manner corresponding to the described lighting module 111. One of the feedthroughs 139 is provided per row 102 per lighting module 111 to 119. One of the feedthroughs 140 is provided per column 103 per lighting module 111 to 119.

Figure 5:
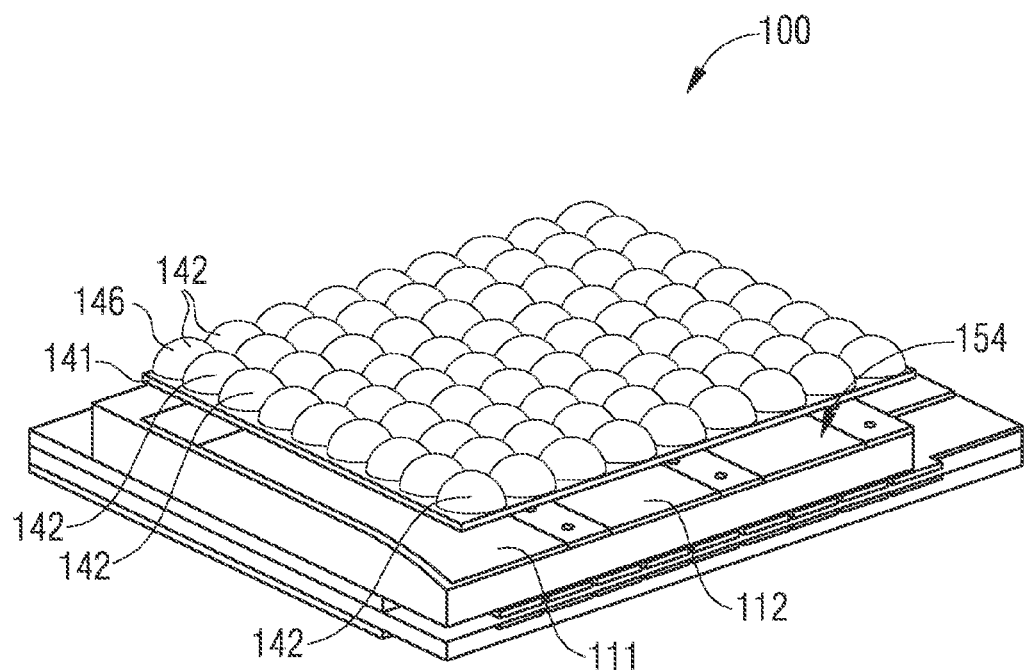
FIG. 5 shows a schematic illustration of an arrangement in accordance with an exemplary embodiment.

FIG. 5 shows the arrangement 100 in accordance with one exemplary embodiment. The carrier 101 has a partial region 141 composed of a light-transmissive molding 146. The partial region 141 is applied to a light exit side 154 of the lighting modules 111 to 119. The molding 146 is applied such that it forms a plurality of integrated optical units 142. In particular, one of the optical units 142 is formed per light-emitting diode 121 to 129 of the lighting modules 111 to 119. It is thus possible to form the pixel-fine optical units 142 during production of the arrangement 100. The optical units 142 are thus molded directly into the partial region 141 in accordance with exemplary embodiments.

Figure 7:
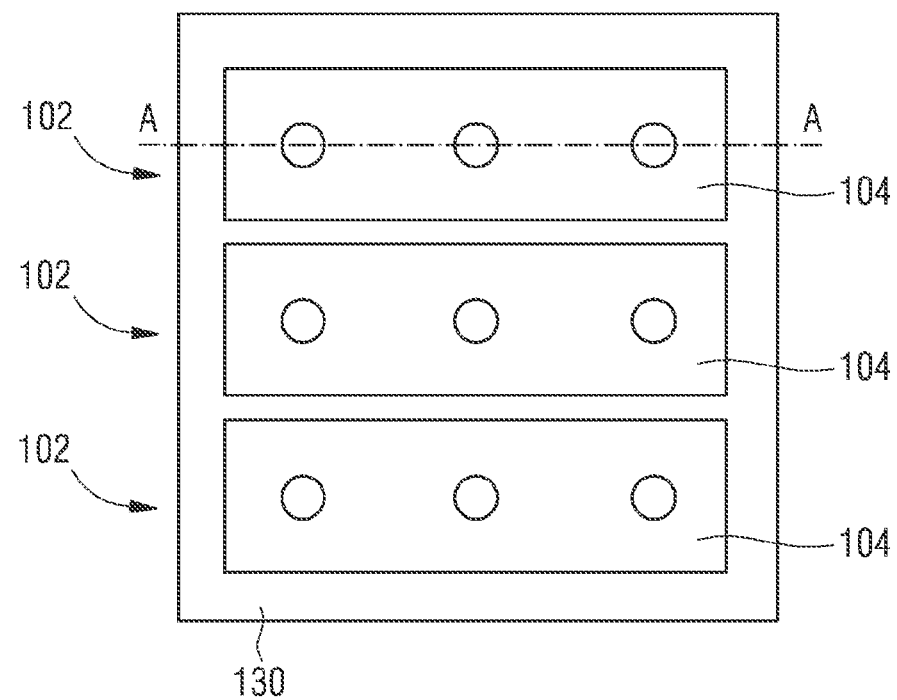

FIGS. 6 and 7 show a first step for producing one of the lighting modules 111 to 119 in accordance with one exemplary embodiment. The semiconductor layer sequence 130 having the active layer 131 is grown epitaxially, for example, on a substrate 147. A plurality of first electrodes 104 are applied to a main side 132 of the semiconductor layer sequence 130 facing away from the substrate 147. The first electrodes 104 are applied in strip-shaped fashion. In particular, the number of first electrodes 104 applied is the same as the number of rows 102 of the light-emitting diodes that are intended to be formed. In this case, FIG. 6 shows a section along the line A-A in FIG. 7. In the exemplary embodiment illustrated, three strip-shaped first electrodes 104 are applied in order to subsequently be able to form three rows 102 of the lighting module.

Figure 8:
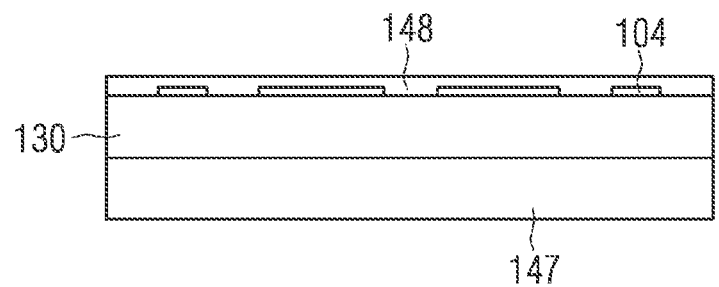

A passivation 148 is subsequently applied to the first electrodes 104, as illustrated in FIG. 8. The passivation 148 serves for electrical insulation, in particular.

Figure 9:
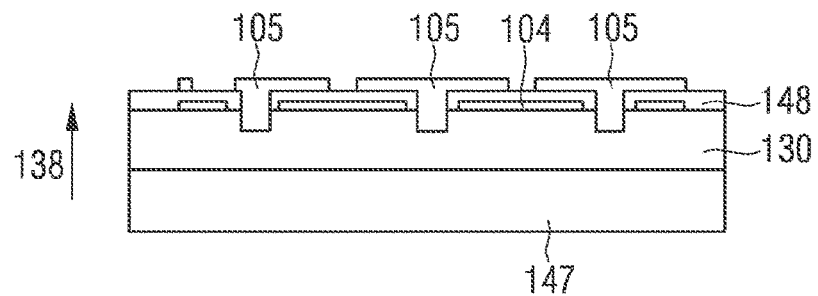
Figure 10:
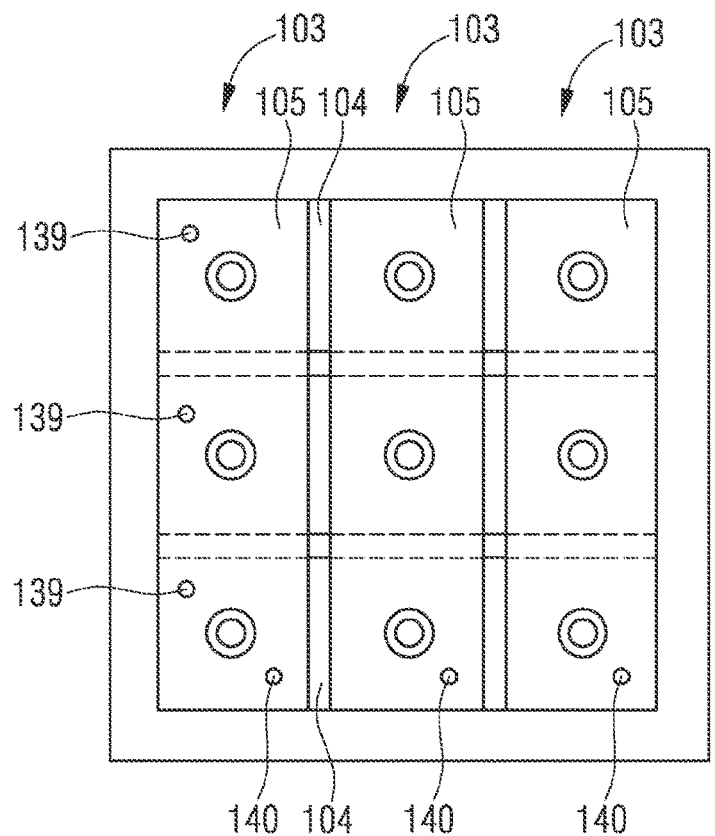

FIGS. 9 and 10 show the subsequently applied second electrodes 105. In particular, one second electrode 105 per column 103 is applied in strip-shaped fashion to the passivation 148. In the exemplary embodiment illustrated, three second electrodes 105 are applied in order to form three columns of the light-emitting diodes in the subsequent lighting module. In addition, the second electrodes 105 are led along the stacking direction 138 regionally through the passivation as far as the semiconductor layer sequence 130 in order to be able to contact the semiconductor layer sequence 130, both with the first electrodes 104 and with the second electrodes 105. As illustrated in FIG. 11, a further passivation 149 is subsequently applied to the second electrodes 105. The first feedthroughs 139 and the second feedthroughs 140 are introduced into the second passivation 149 in order to be able to electrically contact the first electrodes 104 and the second electrodes 105. For this purpose, also the first feedthroughs 139 are additionally introduced into the first passivation 148. Consequently, the first feedthroughs 139 are embodied, for example, as feedthrough openings for contacting a p-type region of the semiconductor layer sequence 130. The second feedthroughs 140 are embodied, for example, as feedthrough openings for contacting an n-type region of the semiconductor layer sequence 130.

Figure 12:
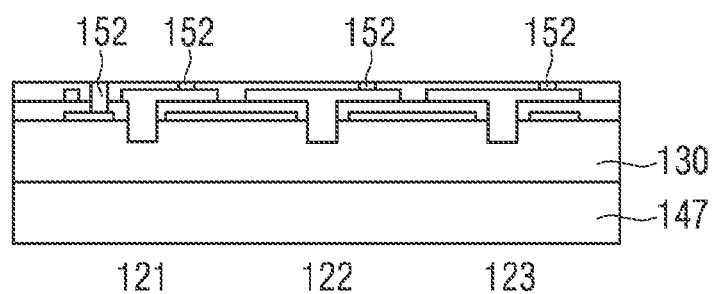

FIG. 12 shows a sectional view of a lighting module 111 to 119 in accordance with one embodiment, wherein the first feedthroughs 139 and the second feedthroughs 140 are each filled with a conductive filling 152 in order to realize a planar plane on the side facing away from the substrate 147.

Figure 13:
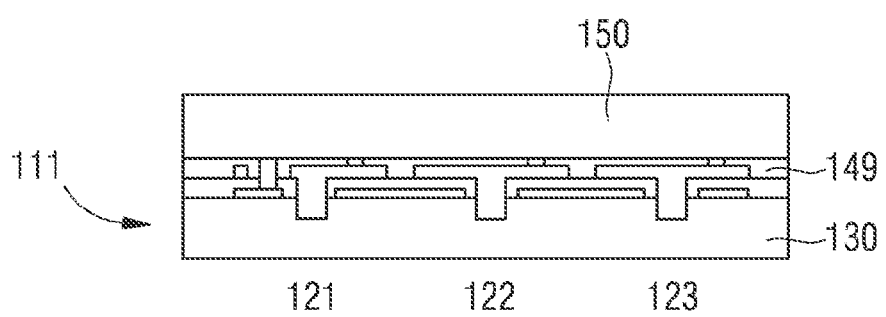

FIG. 13 shows an intermediate step in the production of the arrangement 100, in accordance with which the substrate 147 is detached from the semiconductor layer sequence 130 and, instead, an auxiliary carrier 150 is applied to the further passivation 149 on the opposite side. The auxiliary carrier serves, for example, for transporting one or more of the lighting modules 111 to 119.

Figure 14:
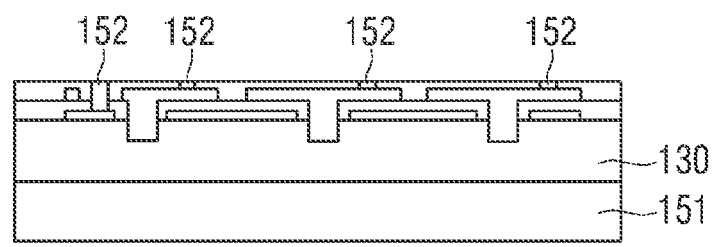

FIG. 14 shows a method step in accordance with a further exemplary embodiment, wherein a further auxiliary carrier 151, as an alternative or in addition to the auxiliary carrier 150, is applied to the side of the semiconductor layer sequence 130 facing away from the electrodes. The further auxiliary carrier 151 thus replaces the substrate 147. The substrate 147 can also be referred to as a growth substrate.

Figure 15:
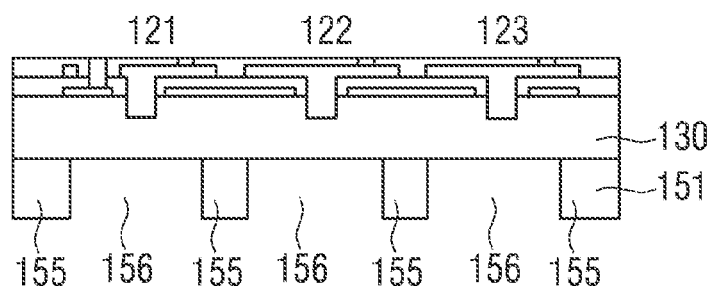

As illustrated in FIG. 15, in accordance with exemplary embodiments, cutouts 156 are introduced into the further auxiliary carrier 151 between projecting regions 155. In particular, one cutout 156 is introduced per light-emitting diode 121 to 129. A pixel grid is thus formed in the further auxiliary carrier 151.

Figure 16:
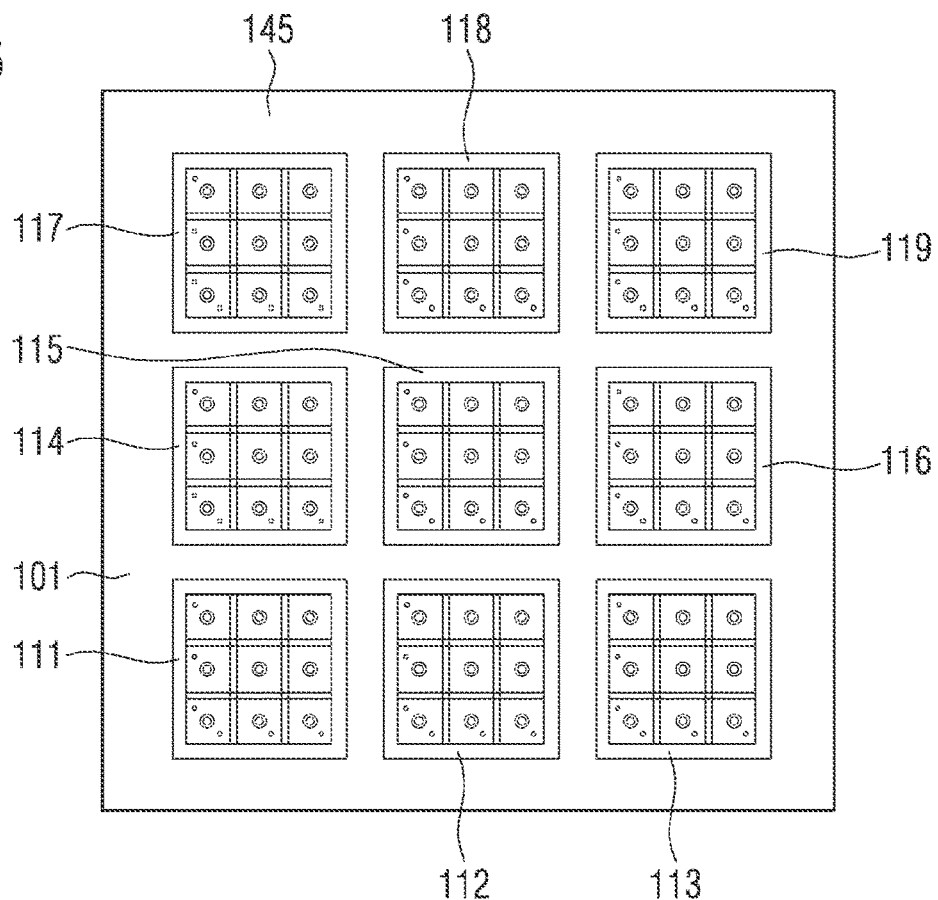

FIG. 16 illustrates that the plurality 110 of the lighting modules 111 to 119 produced according to at least one of the exemplary embodiments described are arranged in rows and columns onto the carrier element 145 of the carrier 101.

Figure 17:
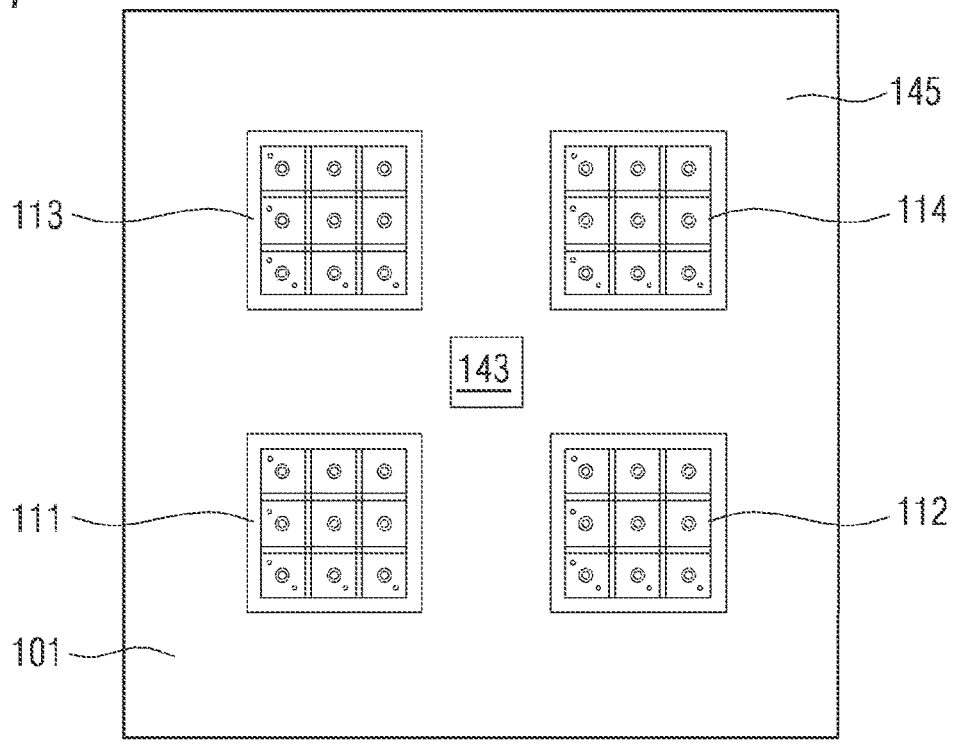

FIG. 17 shows that, in addition to the lighting modules 111 to 119, further components 143 can also be arranged on the carrier element 145. Particularly if the individual lighting modules are at a relatively large distance from one another and are arranged in an expanded manner, it is possible to arrange one further component 143 or a plurality of further components 143.

The further component 143 is, for example, an integrated circuit component, a power switch or a sensor, for example, a brightness sensor. Alternatively or additionally, the further component 143 is a sensor that can be addressed directly by a remote control, for example, by means of infrared. Alternatively or additionally, the further component 143 has a communication interface, for example, for wireless communication by means of Bluetooth or WLAN. It is thus possible to drive the arrangement externally.

Figure 18:
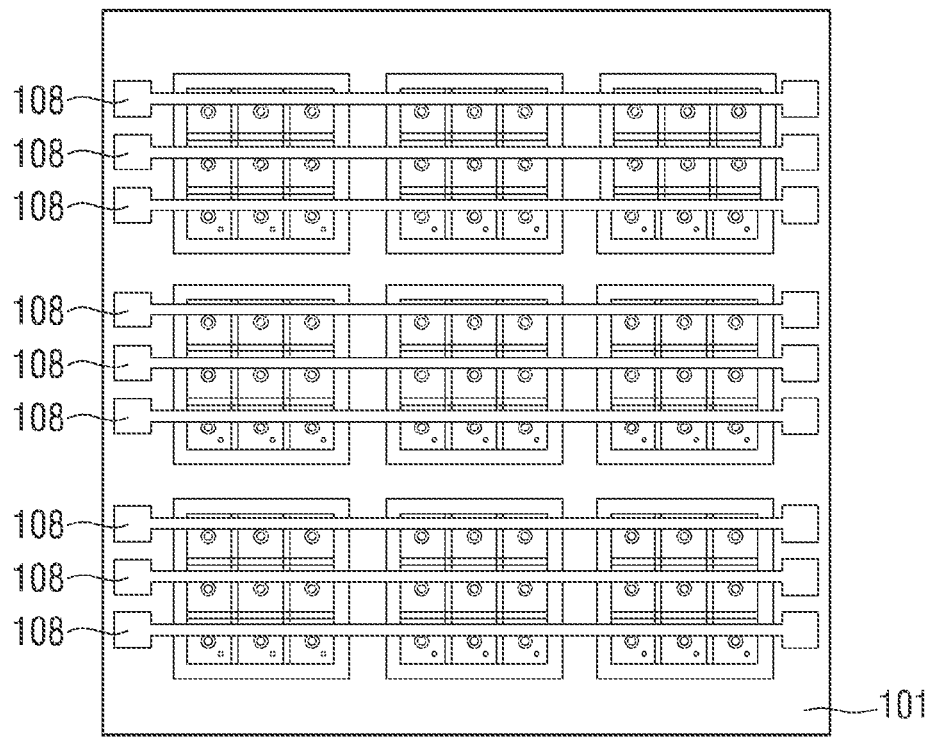

FIG. 18 shows the third electrodes 108, which are applied per row 102 such that they bridge the diodes of the corresponding row of a plurality of lighting modules. The third electrodes 108 are applied such that they are in contact with the respective first feedthroughs 139 per row.

Figure 19:
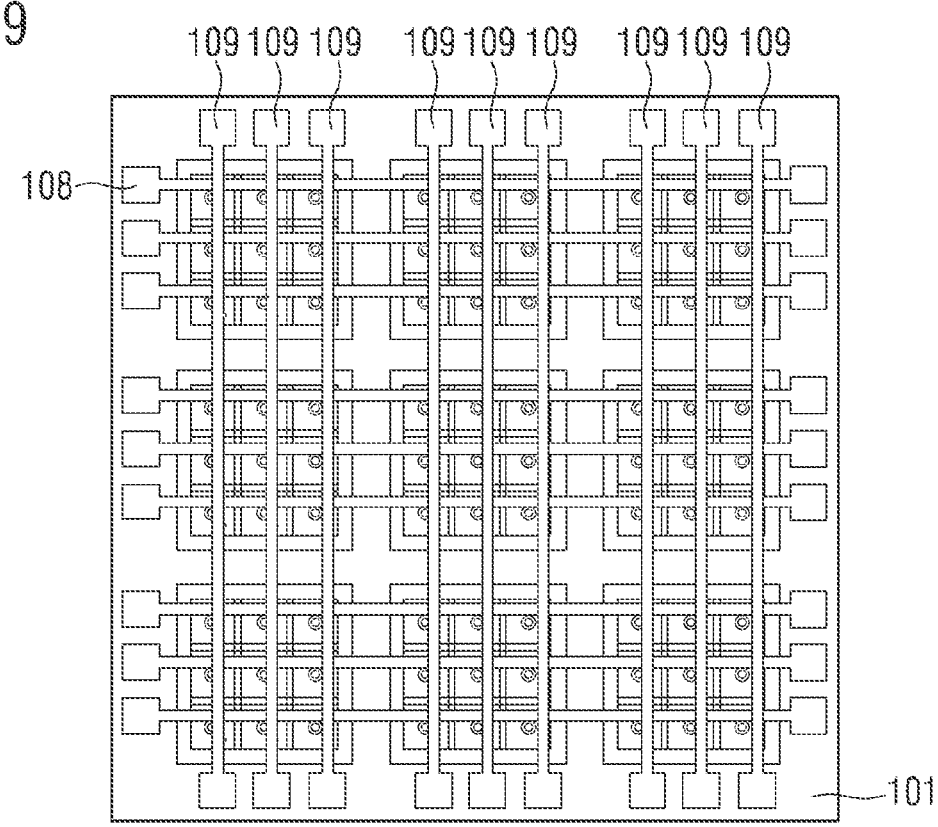

FIG. 19 shows the fourth electrodes 109, which are applied per column 103 such that they cover the light-emitting diodes of the respective column of a plurality of lighting modules. The fourth electrodes 109 are each applied such that they contact the second feedthroughs 114 of the corresponding column.

Figure 20:
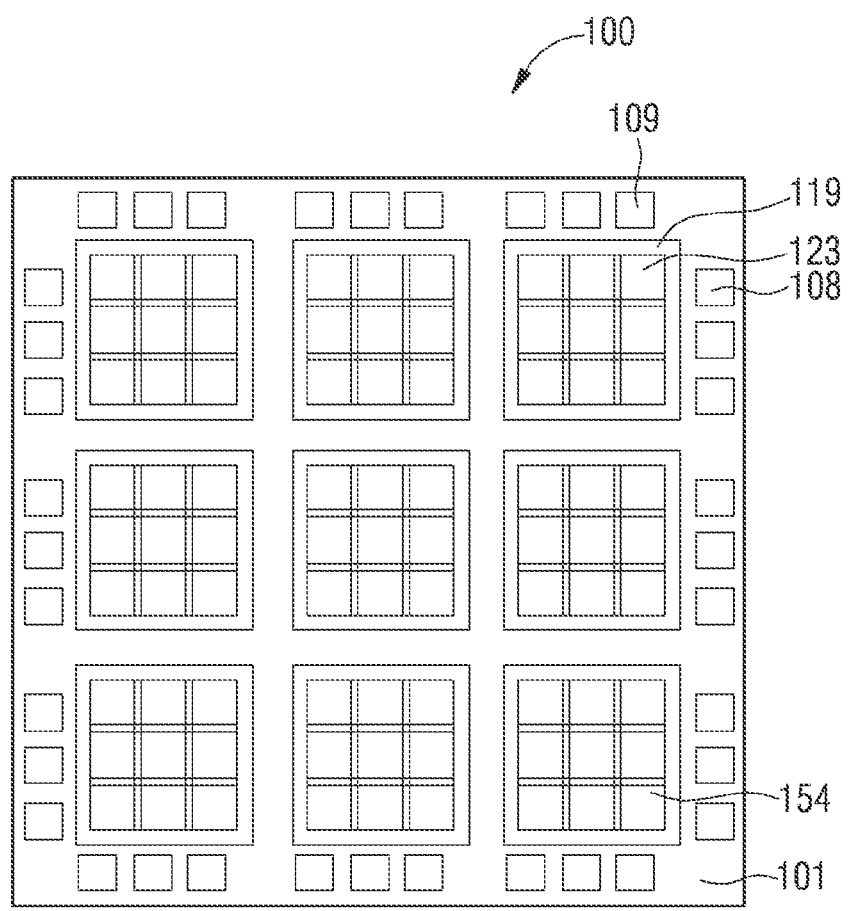

The third electrode 108 and the fourth electrode 109 are composed of a conductive material and are applied such that they are contactable from outside the arrangement 109. By way of example, the arrangement 100 is connected to a current/voltage source by way of respective contact regions of the third electrodes 108 and of the fourth electrodes 109. In this case, the contact regions can lie within the carrier 101, as illustrated in FIGS. 19 and 20. It is also possible to extend the third electrodes 108 and fourth electrodes 109 in each case outside the carrier 101, as illustrated in FIG. 2, for example.

FIG. 20 shows a front side of the arrangement 100 with the light exit side 154 of the lighting modules 111 to 119. As illustrated in FIG. 20, it is possible to extend the third electrodes 108 and the fourth electrodes 109 through the carrier 101 from the rear side onto the front side in order to enable contacts on the emission side. The rear side of the arrangement 100 can then be completely electrically insulated. By way of example, the contact areas of the third electrodes 108 and of the fourth electrodes 109 are uncovered by means of etching.

If, for example, the diode 123 of the lighting module 119 is to be excited to radiate, it is sufficient to apply a voltage to the corresponding third electrode 108 of the row of the diode 123 and the corresponding fourth electrode 109 of the column of the diode 123 in order to energize the diode 123. On account of the redistribution wiring by means of the feedthroughs 139 and 140 to the corresponding first electrode 104 and the corresponding second electrode 105, only the diode 123 is supplied with voltage and caused to emit light.

FIG. 21 shows a schematic illustration of a sectional view through part of the arrangement 100 in accordance with one exemplary embodiment.

The lighting modules 111 and 112 illustrated are arranged along a plane 133. The first electrodes 104 are arranged along a second plane 134. The second plane 134 is spaced apart from the first plane 133 along the stacking direction 138. The second electrodes 109 are arranged along a third plane 135. The third plane 135 is spaced at a further distance from the first plane 133 than the second plane 134. The third electrodes 108 are arranged along a fourth plane 136. The fourth plane 136 is spaced at a further distance from the first plane 133 than the second plane 134 and the third plane 135. The fourth electrodes 109 are arranged along a fifth plane 137. The fifth plane 137 is spaced at a further distance from the first plane 133 than the second plane 134, the third plane 135 and the fourth plane 136. The first plane 133, the second plane 134, the third plane 135, the fourth plane 136 and the fifth plane 137 are oriented parallel to one another, in particular. In particular all exemplary embodiments of the arrangement 100 have this in common.

The semiconductor layer sequences 130 and also the electrodes 104, 105, 108 and 109 are at least partly enclosed by the molding material of the carrier 101. At the light exit side 154, in particular, the semiconductor layer sequences 130 are not covered by the material of the carrier element 145 with the result that light can emerge during operation. By way of example, the molding 146 with the integrated optical units 142 is arranged (not illustrated) at the light exit side 145. The carrier 101 and the semiconductor layer sequences 130 terminate with one another in a plane fashion at the light exit side 154.

FIG. 22 shows a schematic illustration of a sectional view through part of the arrangement 100 in accordance with a further exemplary embodiment. In contrast to FIG. 21, the carrier 101 has projecting regions 155. The carrier projects beyond the semiconductor layer sequences 130. The individual lighting modules are thus separated from one another to a greater extent. The individual semiconductor layer sequences 130 are arranged in cavities in the molding material of the carrier element 145.

Figure 23:
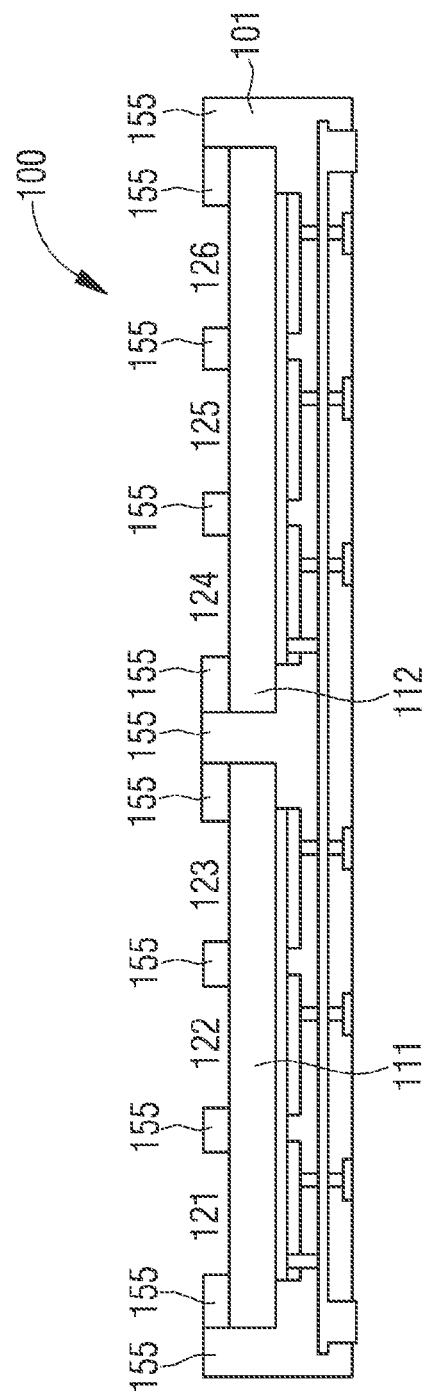

FIG. 23 shows a schematic illustration of a sectional view through part of the arrangement 10 in accordance with a further exemplary embodiment. In contrast to FIG. 22, further projecting regions 155 are arranged on the light exit side 154. The further projecting regions 155 are formed, for example, by the further auxiliary carrier 151, as also explained with reference to FIG. 15. Pixel-fine cavities are thus formed, which separate the individual diodes 121 to 129 of the lighting modules from one another.

Figure 24:
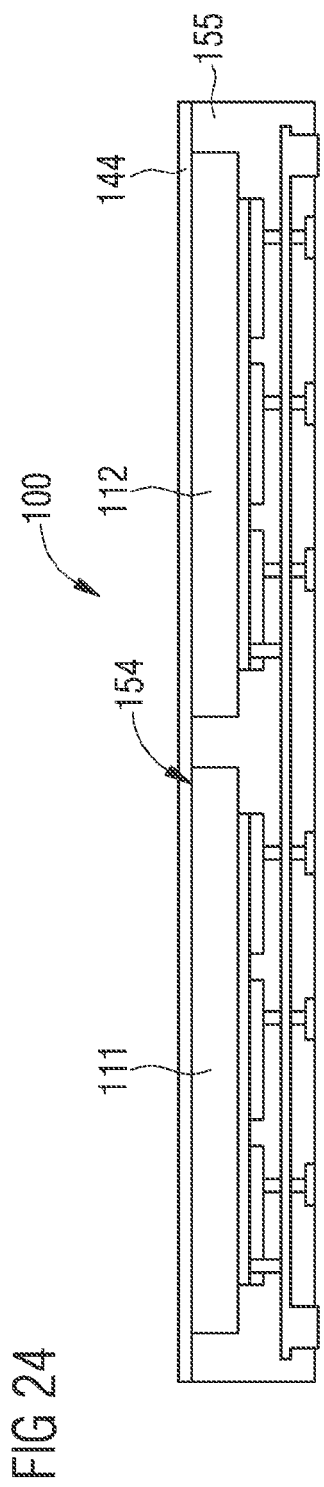

FIG. 24 shows a schematic illustration of a sectional view through part of the arrangement 100 in accordance with a further exemplary embodiment. A first converter 144 covers all lighting modules 111 to 119 over the whole area. In the exemplary embodiment illustrated, the first converter 144 serves, for example, for single-color conversion, such that, for example, the arrangement emits white light overall.

Figure 25:
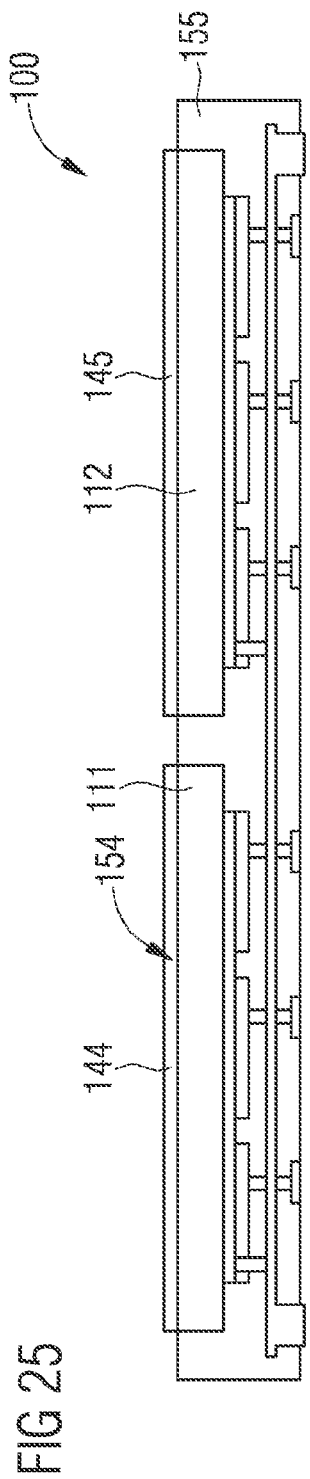

FIG. 25 shows a schematic illustration of a sectional view through part of the arrangement 100 in accordance with a further exemplary embodiment. The first converter 144 is arranged only on one of the lighting modules 111 or a portion of the lighting modules 111 to 119. A second converter 145, which is embodied differently than the first converter 144, covers the lighting module 112 or a further portion of the lighting modules 111 to 119. A plurality of lighting modules can thus form a macropixel since in each case three of the lighting modules each enables an RGB emission (red, green and blue). The macropixels are dimmable, for example, by way of the number of diodes energized per lighting module.

The converter or the converters is/are applied by printing, for example.

Figure 26:
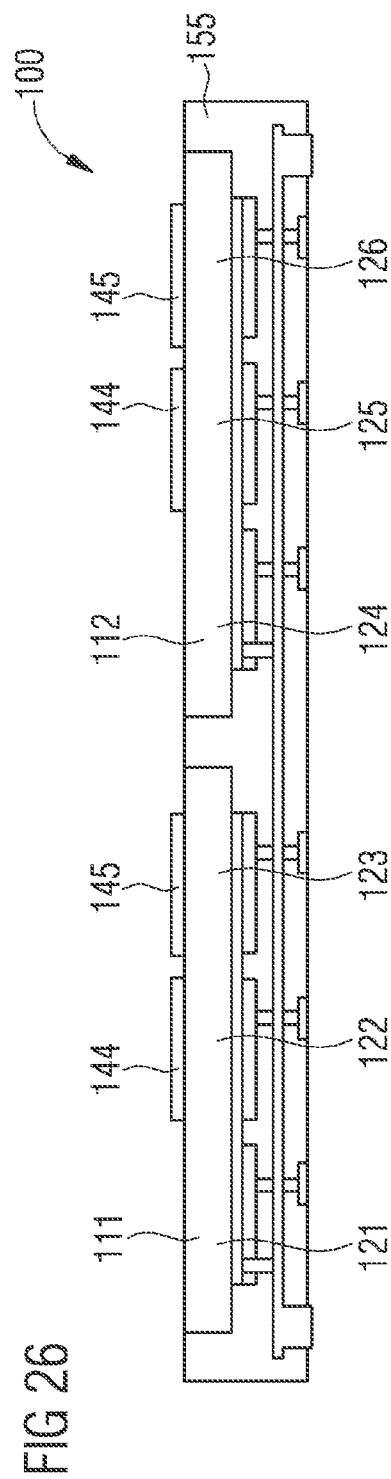

FIG. 26 shows a schematic illustration of a sectional view through part of the arrangement 100 in accordance with a further exemplary embodiment. The first converter 144 covers individual diodes per lighting module, for example, the diodes of a row or of a column. The second converter 145 covers further diodes per lighting module, for example, the diodes of a further row or of a further column. The lighting module diodes that are not covered by a converter are additionally provided. Each lighting module is thus embodied as an RGB pixel. The primary radiation is converted pixel-finely per diode.

Figure 27:
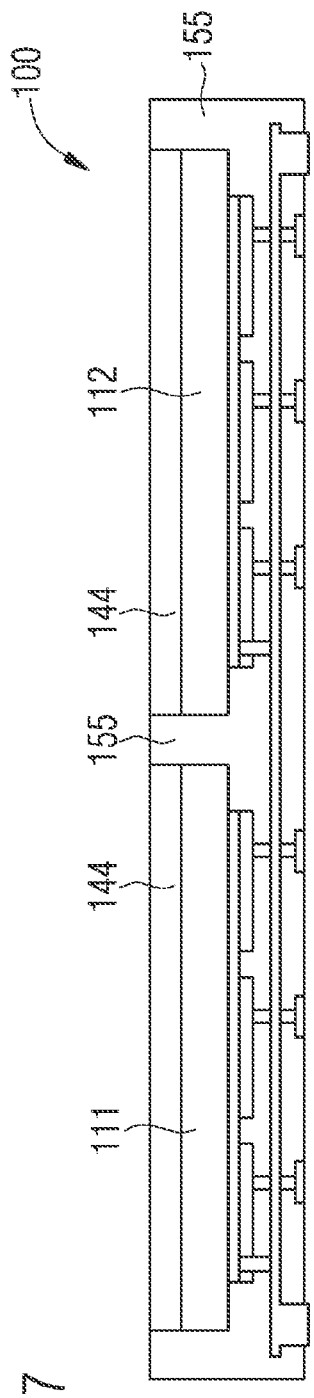

FIG. 27 shows a schematic illustration of a sectional view through part of the arrangement 100 in accordance with a further exemplary embodiment. The arrangement 100 in accordance with FIG. 22 comprising the projecting regions 155 is used to fill the cavities with the first converter 144. All lighting modules are thus covered with the first converter 144, the spreading of which is limited by the projecting regions 155.

Figure 28:
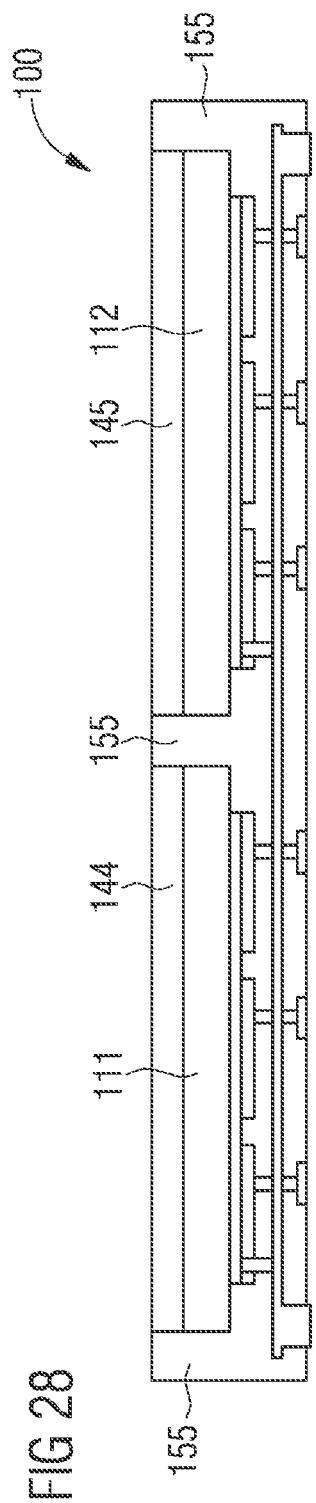

FIG. 28 shows a schematic illustration of a sectional view through part of the arrangement 100 in accordance with a further exemplary embodiment. The cavities between the projecting regions 155 are not filled with the same converter, but rather in one instance with the first converter 144 and in one instance with the second converter 145. This results in one color per lighting module. The spreading of the converters 144 and 145 is limited by the projecting regions 155.

Figure 29:
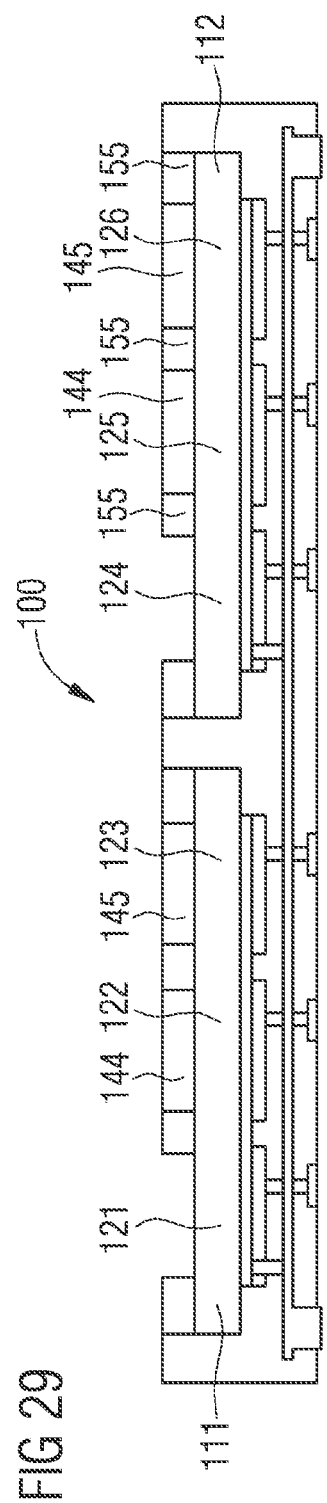

FIG. 29 shows a schematic illustration of a sectional view through part of the arrangement 100 in accordance with a further exemplary embodiment. The arrangement 100 in accordance with FIG. 23 is used to fill the pixel-fine cavities formed by the projecting regions 155 with the first converter 144 and the second converter 145. Consequently, by way of example, each lighting module 111 to 119 is embodied as an RGB pixel by means of pixel-fine conversion in the cavities of the further auxiliary carrier 151. During operation, individual LEDs of the arrangement 100 are driven by means of the energization of the associated corresponding third electrode 108 and fourth electrode 109. If a plurality of LEDs is to be driven, modulated row-by-row driving occurs, for example, so that a uniform image is created for a human observer, but the individual rows are driven successively. It is thus possible to avoid a situation in which a plurality of LEDs, which are not intended to be driven, emit light simultaneously. In the exemplary embodiments in which a portion of the lighting modules comprises sensors integrated in the semiconductor layer sequence 130, these can comprise a spatially resolving optical unit. Alternatively or additionally, external sensor optical units can be arranged, for example, as part of the further component 143. By way of example, the arrangement is configured to generate an illumination spot. During operation, the spot follows movement of a person detected by the sensor.

In accordance with further embodiments, the connections of the arrangement 100 of the third electrodes 108 and fourth electrodes 109 are arranged below the light exit side 154. A spacing-free juxtaposition and joining together of a plurality of lighting modules 111 to 119 is made possible as a result. By way of example, large-area arrangements such as video walls, for example, are made possible as a result.

In accordance with exemplary embodiments, the individual light-emitting diodes of one of the lighting modules 111 to 119 are used as RGB components of an individual pixel of the product by use of different-colored converters. Alternatively or additionally, use is made of a homogeneous converter per lighting module or for the entire arrangement. Accordingly, dimming of the emitted radiation of the arrangement and/or of the lighting modules is possible, depending on the number of energized diodes. Dimming by way of a pulse-width-modulated signal or current-driven dimming can thus be avoided. This is advantageous for the integration with driver electronics. In particular, simpler driver electronics can be used.

The arrangement 100 according to the application enables a simple interconnection and/or driving of complex finely pixelated modules, for example, as headlights of motor vehicles, in particular of headlights or spotlights. Video wall modules can be embodied and driven in a comparatively simple manner. Color locus control is possible in a comparatively simple manner since converter segments having different properties can be activated in a targeted manner.

Alternatively or additionally, direction-dependent space illumination is also possible, particularly if a prism optical unit is provided in front of the individual activatable lighting modules and/or light-emitting diodes. Moreover, it is possible to form integrated optical units that are integrated into the process of the molding-supported semiconductor layer sequences 130 (mold support chip). Overall, the construction of a pixelated arrangement 100 having a resolution resulting from the multiplication of the number of rows 102 and 103 per lighting module 111 to 119 and the number of rows 106 and columns 107 of the lighting modules is made possible. Individual high-resolution micro-optical units can optionally be arranged directly next to one another or spatially separated with the semiconductor layer sequences 130.

The invention is not limited by the description of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An arrangement comprising:
   a plurality of lighting modules held by a carrier, each lighting module comprising a plurality of optoelectronic components arranged in a first number of rows and a second number of columns,
   wherein the lighting modules comprise a respective first number of first electrodes and a respective second number of second electrodes,
   wherein the optoelectronic components of a respective row of the rows are electrically connected to one of the first electrodes of the respective lighting module,
   wherein the optoelectronic components of a respective column of the columns are electrically connected to one of the second electrodes of the respective lighting module,
   wherein the carrier comprises one third electrode per row and one fourth electrode per column, the third and fourth electrodes being electrically contactable in each case from outside the carrier,
   wherein the first electrodes of a respective one of the rows are electrically connected to one of the third electrodes and the second electrodes of a respective one of the columns are connected to one of the fourth electrodes,
   wherein optoelectronic components of a respective one of the lighting modules comprise a common semiconductor layer sequence extending in a planar manner having an active layer, and
   wherein the first electrodes and the second electrodes each being strip-shaped, and each being arranged at a main side of the semiconductor layer sequence.

2. The arrangement as claimed in claim 1,
   wherein the lighting modules are arranged next to one another along a first plane,
   wherein the first electrodes are arranged along a second plane,
   wherein the second electrodes are arranged along a third plane,
   wherein the third electrodes are arranged along a fourth plane,
   wherein the fourth electrodes are arranged along a fifth plane, and
   wherein the second, the third, the fourth and the fifth plane are spaced at different distances from the first plane.

3. The arrangement as claimed in claim 2, further comprising:
   a first feedthrough connecting the first electrode in each case to the corresponding third electrode; and
   a second feedthrough connecting the second electrode in each case to the corresponding fourth electrode,
   wherein the first feedthrough and the second feedthrough are each oriented transversely with respect to the first plane.

4. The arrangement as claimed in claim 1, wherein the carrier comprises a light-transmissive partial region composed of a molding, which covers the lighting modules on a side facing away from the electrodes, and wherein the partial region comprises a plurality of integrated optical units respectively assigned to one of the optoelectronic components.

5. The arrangement as claimed in claim 1, further comprising at least one further component held by the carrier and electrically coupled to the lighting modules.

6. The arrangement as claimed in claim 1, further comprising:
   a first converter configured to partially convert a primary radiation, the first converter covering a portion of the lighting modules; and
   a second converter configured to partially convert the primary radiation, the second converter covering a further portion of the lighting modules.

7. The arrangement as claimed in claim 1, further comprising a converter configured to partially convert a primary radiation, the converter covering all of the lighting modules.

8. The arrangement as claimed in claim 1, further comprising:
   a first converter configured to partially convert a primary radiation, the first converter covering a portion of the optoelectronic components; and
   a second converter configured to partially convert the primary radiation, the second converter covering a further portion of the optoelectronic components.

9. A method for producing an arrangement comprising a plurality of lighting modules, the method comprising:
   providing the plurality of lighting modules, each light emitting module comprising a plurality of optoelectronic components arranged in a first number of rows and a second number of columns,
   wherein providing the lighting modules in each case comprises providing a semiconductor layer sequence extending in a planar manner having an active layer and applying first and second electrodes to a main side of the semiconductor layer sequence,
   wherein each lighting module comprises a first number of first electrodes and a second number of second electrodes, and
   wherein the optoelectronic components of a respective row of the rows are electrically connected to one of the first electrodes of the respective lighting module, and the optoelectronic components of a respective column of the columns are electrically connected in each case to one of the second electrodes of the respective lighting module;
   arranging the lighting modules on a common carrier element;
   applying one third electrode to the carrier element per row and one fourth electrode per column;
   electrically connecting the first electrodes of a respective one of the rows to one of the third electrodes; and
   electrically connecting the second electrodes of a respective column to one of the fourth electrodes.

10. The method as claimed in claim 9, further comprising:
applying a molding to a side of the lighting modules facing away from the electrodes; and
forming a plurality of optical units by the molding such that a respective optical unit of the optical units is assigned to one of the optoelectronic components.

11. The method as claimed in claim 9, further comprising:
applying a first converter for a partial conversion of a primary radiation to a portion of the lighting modules; and
applying a second converter to a further portion of the lighting modules.

12. The method as claimed in claim 9, further comprising:
applying a first converter for a partial conversion of a primary radiation to a portion of the optoelectronic components; and
applying a second converter to a further portion of the optoelectronic components.

13. The method as claimed in claim 9, further comprising:
arranging at least one further component on the carrier element; and
electrically coupling the at least one further component to the optoelectronic components.

\* \* \* \* \*